US012776767B2

(12) United States Patent
Manian et al.

(10) Patent No.: US 12,776,767 B2
(45) Date of Patent: Oct. 27, 2026

(54) METHODS AND APPARATUS TO IMPLEMENT DELAY LINES AND ANALOG TO DIGITAL CONVERTERS

(71) Applicant: Texas Instruments Incorporated, Dallas, TX (US)

(72) Inventors: Srikanth Manian, Bangalore (IN); Anant Kamath, Bangalore (IN); Rohan Regi, Gurugram (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 70 days.

(21) Appl. No.: 18/932,058

(22) Filed: Oct. 30, 2024

(65) Prior Publication Data

US 2026/0121624 A1 Apr. 30, 2026

(51) Int. Cl.
*H03K 5/14* (2014.01)
*H03M 1/12* (2006.01)
*H03K 5/00* (2006.01)
*H03K 5/135* (2006.01)

(52) U.S. Cl.
CPC ................ *H03K 5/14* (2013.01); *H03M 1/12* (2013.01); *H03K 2005/00247* (2013.01); *H03K 5/135* (2013.01)

(58) Field of Classification Search
CPC ........... H03M 1/12; H03K 5/14; H03K 5/135; H03K 2005/00
See application file for complete search history.

(56) References Cited

U.S. PATENT DOCUMENTS

2022/0038084 A1* 2/2022 Kramer .................. H03K 5/131

OTHER PUBLICATIONS

Texas Instruments Incorporated, "UCD3138," retrieved from https://www.ti.com/product/UCD3138 on Jun. 20, 2024, 13 pages.
Texas Instruments Incorporated, "Understanding Functional Safety FIT Base Failure Rate Estimates per IEC 62380 and SN 29500," Technical White Paper, SLOA294A—Jun. 2020—revised Apr. 2024, 9 pages.
Texas Instruments Incorporated, "UCD3138 Highly Integrated Digital Controller for Isolated Power," Data sheet, SLUSAP2J—Mar. 2012—Revised Nov. 2021, 101 pages.

* cited by examiner

*Primary Examiner* — Joseph J Lauture
(74) *Attorney, Agent, or Firm* — Charles F. Koch

(57) ABSTRACT

An example apparatus includes: a first delay buffer having a clock input, a bias input coupled to a delay control input, a reset input, and an output; a second delay buffer having a clock input coupled to the output of the first delay buffer, a bias input coupled to the delay control input, a reset input, and an output; and a counter having a clock input coupled to the output of the second delay buffer, a reset output coupled to a clear input of the first delay buffer and the clear input coupled to the second delay buffer, and an output.

20 Claims, 6 Drawing Sheets

METHODS AND APPARATUS TO IMPLEMENT DELAY LINES AND ANALOG TO DIGITAL CONVERTERS

TECHNICAL FIELD

This description relates generally to integrated circuits and, more particularly, to methods and apparatus to implement delay lines and analog to digital converters.

BACKGROUND

Delay lines include a series of delay circuit elements to delay an electrical signal (e.g., a digital signal) by a set amount. For example, a set of buffers may be connected in series to delay a signal. Delay lines may be used in many applications. For example, delay lines are used in some implementations of analog to digital converters.

SUMMARY

For delay lines, an example buffer line apparatus includes a first delay buffer having a clock input, a bias input coupled to a delay control input, a reset input, and an output; a second delay buffer having a clock input coupled to the output of the first delay buffer, a bias input coupled to the delay control input, a reset input, and an output; and a counter having a clock input coupled to the output of the second delay buffer, a reset output coupled to a clear input of the first delay buffer and the clear input coupled to the second delay buffer, and an output. Other examples are described.

For delay lines, an example analog to digital converter includes an analog delay control input; a signal input; a plurality of delay buffers connected in series, a first delay buffer of the plurality of delay buffers coupled to the signal input; a first counter having a clock input coupled to an output of a last delay buffer in the plurality of delay buffers; a plurality of flip flops including clock inputs respectively coupled to outputs of the delay buffers of the plurality of delay buffers; a thermometer to binary converter coupled to outputs of the plurality of flip flops; and binary data outputs based on an output of the first counter and outputs of the thermometer to binary converter. Other examples are described.

For delay lines, an example method includes a method to convert an analog voltage to a digital value, the method including: repeatedly passing a signal through a first series of delay buffers biased by a reference voltage; repeatedly passing the signal through a second series of delay buffers biased by an input voltage; after the signal has passed through the first series of delay buffers a set number of times, determining a number of delay buffers in the second series of delay buffers that the signal has passed through and the number of loops; and outputting a binary value based on the number of delay buffers in the second series of delay buffers that the signal has passed through and the number of passes through the second series of delay buff. Other examples are described.

Figure 1:
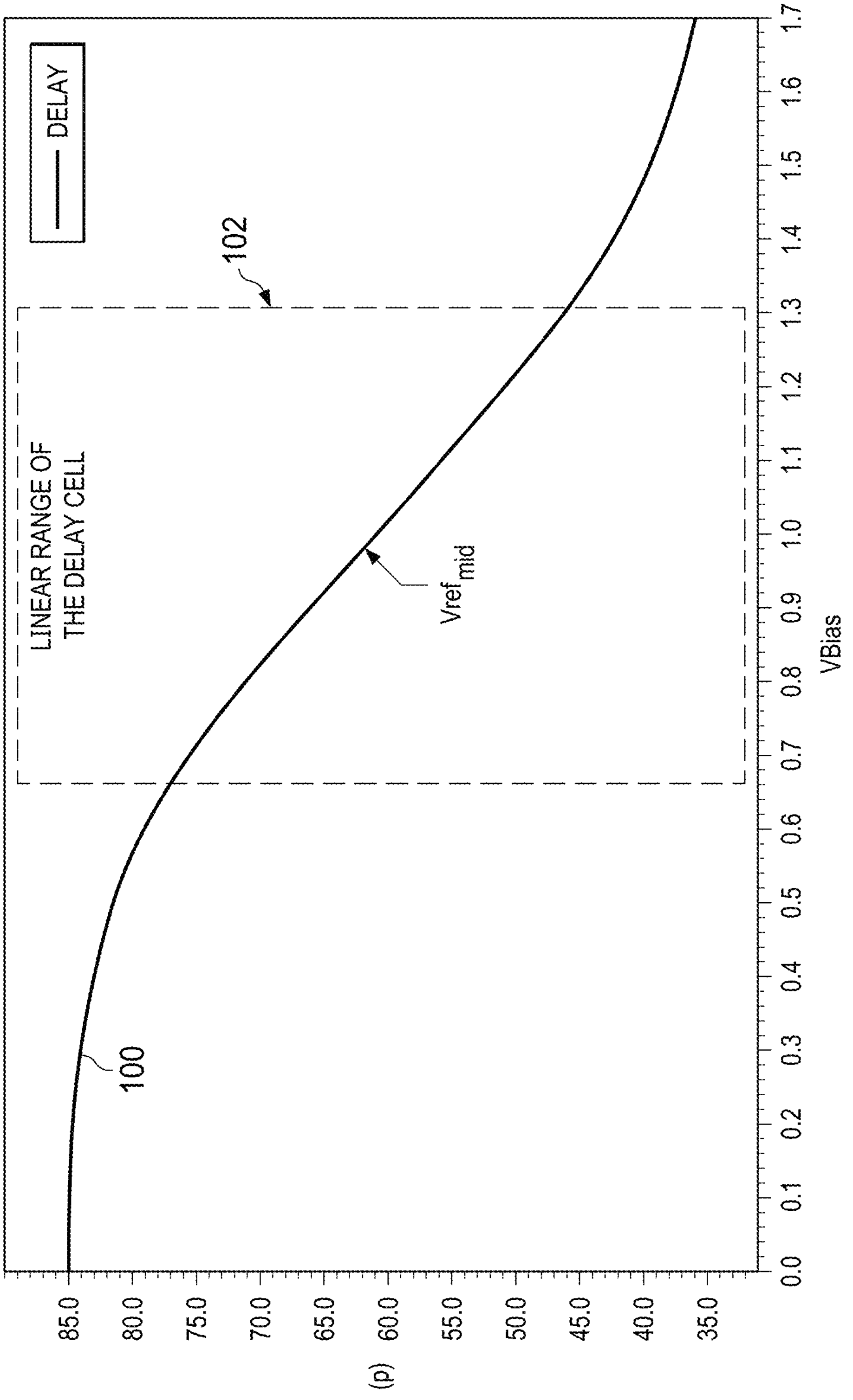
FIG. 1 illustrates the delay response of a delay circuit element over an operational voltage range.

The drawings are not necessarily to scale. Generally, the same reference numbers in the drawing(s) and this description refer to the same or similar (functionally and/or structurally) features and/or parts. Although the drawings show regions with clean lines and boundaries, some or all of these lines and boundaries may be idealized. In reality, the boundaries or lines may be unobservable, blended or irregular.

DETAILED DESCRIPTION

When implementing delay lines, the amount of delay needed for a circuit may call for a large number of delay circuit elements. For example, an analog to digital converter design may utilize 64 delay circuit elements to provide six bits of resolution for the digital result. Such large numbers of delay circuit elements may require a large physical space and increase the cost of a circuit.

Delay lines disclosed herein utilize a reduced number of delay circuit elements in combination with a counter to loop through the delay circuit elements multiple times to implement the equivalent of a large number of circuit elements. Analog to digital converters disclosed herein utilize the delay lines to provide efficient use of voltage-to-time digital conversion with reduced circuit elements.

FIG. 1 illustrates the delay response of a delay circuit element over an operational voltage range. As shown in FIG. 1, line 100 illustrates that the amount of delay generally increases as the voltage level decreases. Further, as shown by box 102, the example delay circuit includes a linear operation range between approximately 0.7 volts and 1.3 volts. The delay circuit elements can be utilized in the linear range to provide consistent voltage-to-delay response. Accordingly, when designing a circuit, the number of delay circuit elements is chosen in order to keep the input voltage spread across the proper number of delay circuit elements to keep the voltage within the linear range of the delay circuit elements.

Figure 2:
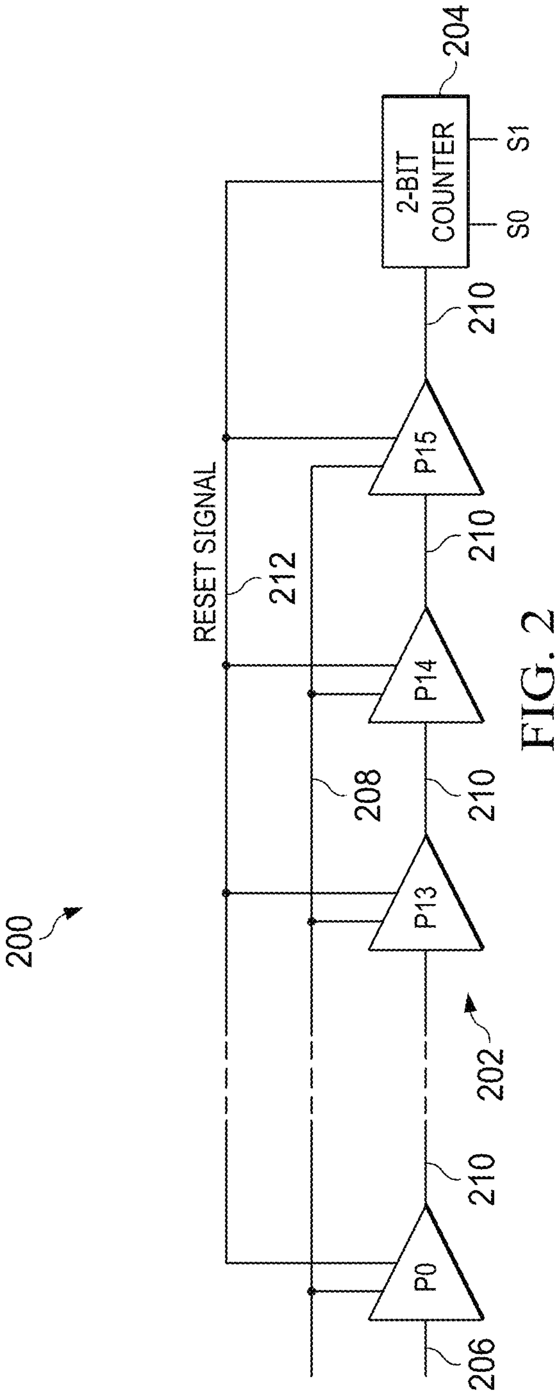
FIG. 2 illustrates an example delay line circuit that includes sixteen delay buffers connected in series and a 2-bit counter.

FIG. 2 illustrates an example delay line circuit 200 that includes sixteen delay buffers 202 connected in series and a 2-bit counter 204. The example circuit 200 can emulate 64 delay buffers using only the sixteen delay buffers 202. While the sixteen delay buffers 202 and the 2-bit counter 204 are included in the illustrated example, any number of delay buffers and any bit counter could be used in other implementations.

The delay line circuit 200 includes a signal input 206 and a delay control input 208. The signal input 206 is connected to a clock input of a first one of the sixteen delay buffers 202 and is delayed by each of the delay buffers 202 that the signal is passed through. The delayed signal can be accessed at an output 210 of each of the delay buffers 202. The amount of delay for each of the delay buffers 202 is controlled by the delay control input 208 coupled to a bias input of each of the delay buffers 202. According to the illustrated example, the amount of delay decreases as the magnitude of the signal input 206 increases. Alternatively, other types of delay buffers may be utilized. For example, a circuit may utilize delay buffers with fixed delays, delay buffers with delays that increase as voltage increases, etc.

In the example delay line circuit 200, the output of the last one of the delay buffers 202 is coupled to an input of the 2-bit counter 204. When the input to the 2-bit counter 204 is high (e.g., when a signal is output by the last one of the delay buffers 202), the 2-bit counter 204 increments its output count (S0 and S1). The outputs S0 and S1 cycle through 0,0 to 0,1 to 1,0, to 1,1 and then back to 0,0. The 2-bit counter 204 outputs a reset signal 212 each time the 2-bit counter 204 increments. The reset signal 212 is coupled to a clear input terminal of each of the sixteen delay buffers 202. Accordingly, each time the 2-bit counter 204 increments, the sixteen delay buffers 202 clear and restart delay buffering of the signal input 206. Thus, another round of buffering begins. By the time the 2-bit counter 204 has incremented four cycles (e.g., starting at 0,0 and continuing until the count increments to 0,0; starting at 1,1 and continuing until the count increments to 1,1; etc., the signal input 206 has been delayed 64 times (four rounds of sixteen delay buffers). The signal input 206 can be read after 64 delays at the output 210 of the last one of the sixteen delay buffers 202 when the output of the 2-bit counter 204 has incremented four times. A timing of 64 delays can also be determined by monitoring the output of the 2-bit counter 204. For example, a timing of 64 delays can be determined when the 2-bit counter 204 has incremented four times (e.g., cycling from 1,1 to 0,0 to 0.1 to 1,0 and back to 1,1).

Figure 3:
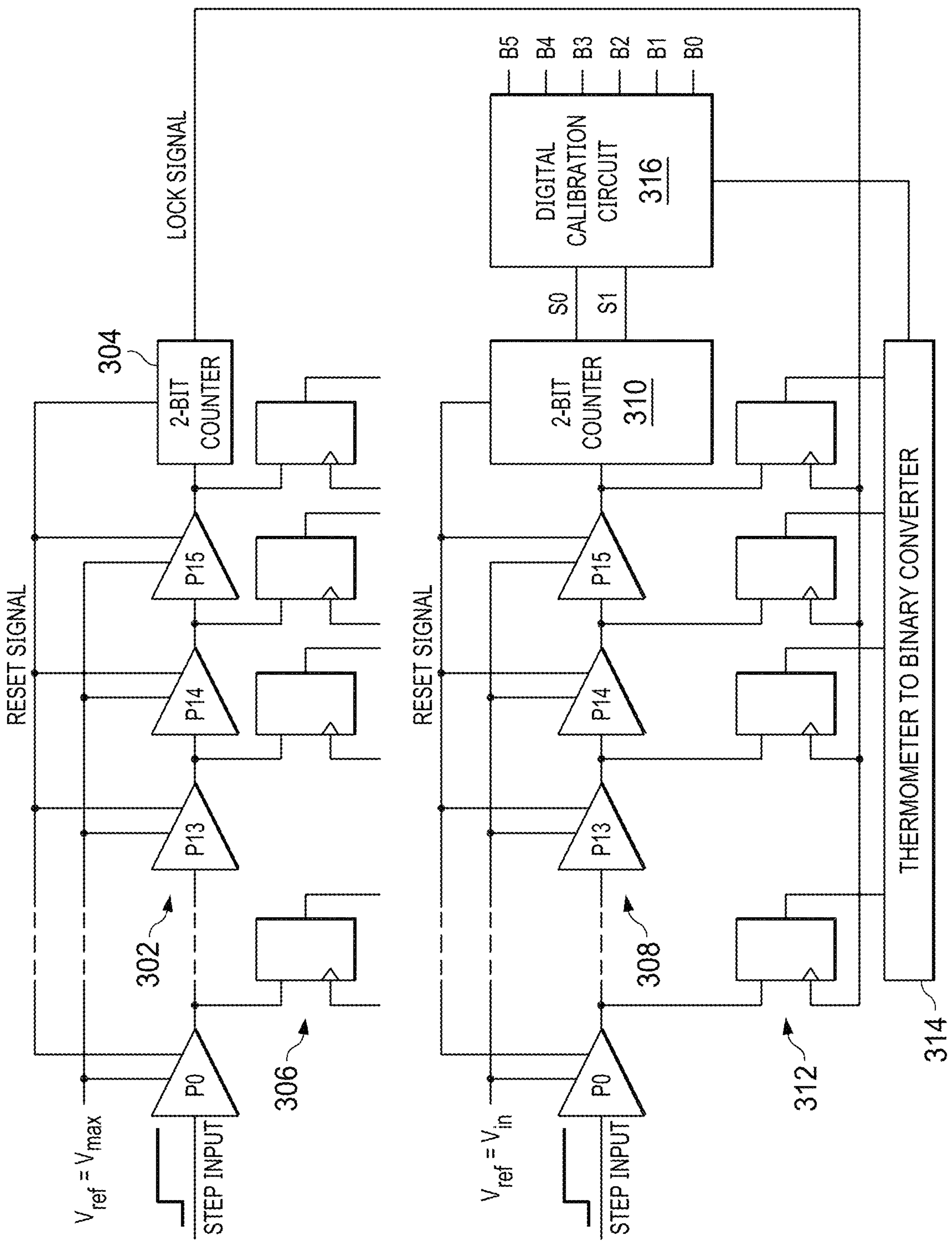
FIG. 3 illustrates an example analog to digital converter (ADC).

FIG. 3 illustrates an example analog to digital converter (ADC) circuit 300 that utilizes the structure of the delay line circuit 200. The example ADC circuit 300 includes a reference set of sixteen delay buffers 302, a reference 2-bit counter 304, a reference set of sixteen flip flops 306, a data set of sixteen delay buffers 308, a data 2-bit counter 310, a data set of sixteen flip flops 312, a thermometer to binary converter 314, and a digital calibration circuit 316. The ADC circuit 300 outputs a 6-bit value indicative of the voltage Vin applied to the clock input of a first delay buffer of the data set of sixteen delay buffers 308.

Similar to the delay line circuit 200, the reference set of sixteen delay buffers 302 are connected in series where the output of one of the delay buffers is connected to the clock input of the next delay buffer. In addition, an output of each of the reference set of sixteen delay buffers 302 is connected to a data input of a respective flip flop of the reference set of sixteen flip flops 306. A high voltage Vmax is connected to the bias input of each of the delay buffers of the reference set of sixteen delay buffers 302. According to the example circuit 300, the high voltage is a maximum voltage that can be detected (e.g., converted from analog to digital) by the circuit 300.

An output of a last delay buffer of the reference set of sixteen delay buffers 302 is connected to a clock input of the reference 2 bit counter 304. A reset output of the reference 2-bit counter 304 is connected to a reset input of each of the reference set of delay buffers 302.

The ADC circuit 300 includes a data set of sixteen delay buffers 308 connected in series where the output of one of the delay buffers is connected to the clock input of the next delay buffer. In addition, an output of each of the data set of sixteen delay buffers 308 is connected to a data input of a respective flip flop of the data set of sixteen flip flops 312. An input voltage Vin is connected to the bias input of each of the delay buffers of the data set of sixteen delay buffers 308. Vin is an analog voltage to be converted to a digital output value by the ADC circuit 300.

An output of a last delay buffer of the data set of sixteen delay buffers 308 is connected to a clock input of the data 2-bit counter 310. A reset output of the data 2 bit counter 310 is connected to a reset input of each of the data set of delay buffers 308.

An output of the reference 2-bit counter 304 is coupled to a lock input of each of the data set of sixteen flip flops 312 to lock the data input of each of the data set of sixteen flip flops 312 when the output of the reference 2-bit counter 304 reaches a predetermined value (e.g., when the reference 2 bit counter 304 increments to 1,1).

Outputs of each flip flop of the data set of sixteen flip flops 312 are connected to the thermometer to binary converter 314. The thermometer to binary converter 314 may be implemented by any type of thermometer to binary converter circuitry to convert a thermometer value corresponding to the outputs of the data set of sixteen flip flops 312 to a binary value. The example thermometer to binary converter 314 outputs a 4-bit binary value representative of the 16-bit thermometer input from the sixteen flip flops 312 (e.g., when the output of all of the data set of sixteen flip flops 312 is low/zero the thermometer to binary converter 314 may output 0000, when the output of all of the data set of sixteen flip flops 312 is high/one the thermometer to binary converter 314 may output 1111, when the output of the first eight flip flops of the data set of sixteen flip flops 312 is high/one and the output of the last eight flip flops of the data set of sixteen flip flops 312 is low/zero the thermometer to binary converter 314 may output 0111, etc.).

An output of the data 2-bit counter 310 and an output of the thermometer to binary converter 314 are coupled to the digital calibration circuit 316. The digital calibration circuit 316 combines to the outputs to generate a 6-bit digital value indicative of a voltage of the voltage input Vin. The example digital calibration circuit 316 sets the most significant two bits of the 6-bit digital value as the two bits S0 and S1 output by the data 2-bit counter 310 and the least significant four bits of the 6-bit digital value as the four bits output by the thermometer to binary converter 314.

In operation of the ADC circuit 300, when a step input is supplied to the clock input of the first delay buffer of the reference set of delay buffers 302, the step input is delayed 64 delays at a shortest duration of delays set by Vmax. At the same time, the step input is delayed through the data set of sixteen delay buffers 308. As the voltage Vin is a voltage that is lower than Vmax, the delay of each delay buffer of the data set of sixteen delay buffers 308 is longer than the delay of each delay buffer of the reference set of sixteen delay buffers 302. Accordingly, after four rounds of delay through the delay buffers of the reference set of sixteen delay buffers 302, when the lock signal is passed to the data set of sixteen flip flops 312, step input will not have passed through as many delay buffers of the data set of sixteen delay buffers 308. Which of the flip flops of the data set of sixteen flip flops are set to high/one and which of the bits of the data 2 bit counter 310 are set to high/one will, thus, be indicative of the voltage of Vin as compared with the voltage of Vmax.

For example, if the voltage Vin is 1 volt and Vmax is 1.3 Volts, in the time it takes for four passes through the reference set of sixteen delay buffers 302, the data set of sixteen delay buffers 308 will have made two passes and none of the delay buffers in the data set of sixteen delay buffers 308 will have been set to high/one. Thus, the output of the digital calibration circuit 316 will be 100000.

After the digital value is output by the digital calibration circuit 316, the data 2-bit counter 310 is reset and the step input continues to be delayed through the reference set of sixteen delay buffers 302 continuing to increment the reference 2-bit counter 304.

Figure 4:
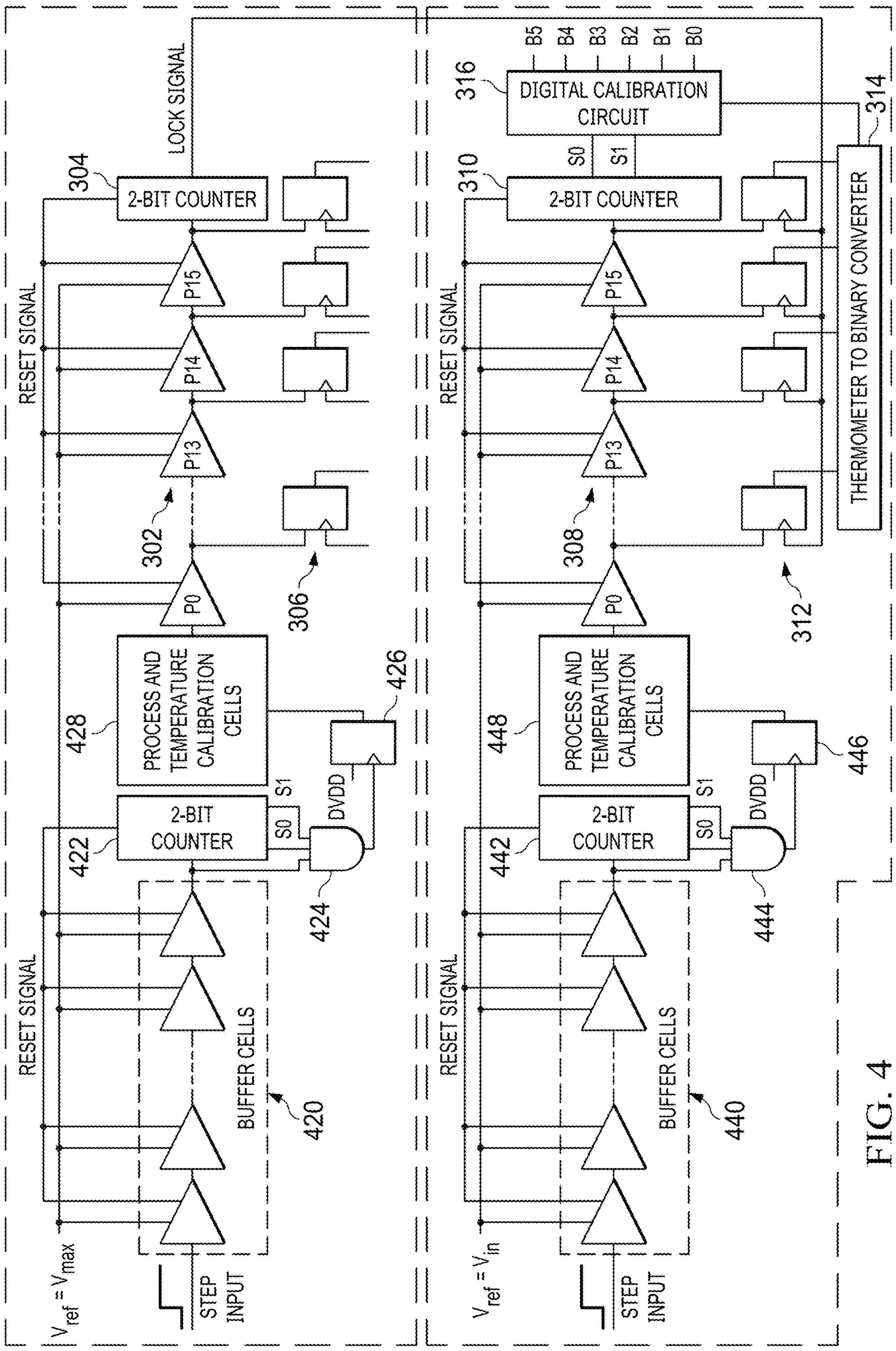
FIG. 4 is a illustrates another example ADC circuit.

FIG. 4 is a illustrates another example ADC circuit 400 that includes the components of the ADC circuit 300 plus additional components. To enable the structure of the ADC circuit 400 to operate within the linear range of the delay buffers in the circuit, the ADC circuit 400 is configured such that when Vmax is applied to the Reference portion of the circuit and Vin in the minimum value for the circuit, only the very first delay buffer in the data set of sixteen delay buffers 308 should go high after the four passes through the reference set of sixteen delay buffers 302. The time taken to go through the reference set of sixteen delay buffers is $2^N*T_{dVmax}$ nanoseconds, where N is the number of number of bits in the digital result and $T_{dVmax}$ is the delay of on delay buffer when biases with Vmax. For an example delay buffer with a $T_{dVmax}$ of 50 picoseconds, the time taken through the reference set of sixteen delay buffers is 3.2 nanoseconds. To keep the delay buffers in their linear region while achieving the 3.2 nanoseconds of range between Vmin and Vmax, the ADC circuit 400 additionally includes a preliminary reference set of delay buffers 420, a preliminary reference 2-bit counter 422, an AND gate 424, a flip flop 426, a process and temperature calibration circuit 428, a preliminary data set of delay buffers 440, a preliminary data 2-bit counter 442, an AND gate 444, a flip flop 446, and a process and temperature calibration circuit 448. The additional delay buffers 420 and 440 in the reference and data portions of the ADC circuit 400 park the delay buffers in their linear region. Due to the increase in power and area required by such a large number of delay buffers, utilizing looping delay buffers with a counter enables the reuse of the delay buffers (e.g., 4 times reduction in delay buffers with a 2-bit counter). Such reuse provides the reduction of the area and power required by delay buffers as compared with a circuit with a full set of delay buffers.

The preliminary reference set of delay buffers 420 and the preliminary data set of delay buffers 440 include 30 delay buffers. The 30 delay buffers operating with the preliminary reference 2-bit counter 422 and the preliminary data 2-bit counter 442, respectively, add sufficient delays to provide the equivalence of 120 delay buffers in the reference line and the data line to keep delay buffers of the ADC circuit 400 operating in the linear region for Vin between Vmin and Vmax. Alternatively, other numbers of delay buffers may be utilized in circuit with different time constraints, delay buffer linear regions, and/or voltage ranges.

Similar to the ADC circuit 300, a reference voltage of Vmax is supplied as the bias to the preliminary reference set of delay buffers 420 and a step input as supplied as the clock input to preliminary set of delay buffers 420. The output of the last delay buffer of the preliminary set of delay buffers 420 and outputs of the preliminary reference 2-bit counter 422 are coupled to the AND gate 424. When all of the inputs to the AND gate 424 are high/one, the AND gate 424 outputs a high/one signal to a clock input to the flip flop 426. A voltage signal DVDD (e.g., a high digital signal) is coupled to a data input to the flip flop 426. When the AND gate 424 outputs the high/one signal the flip flop 426 outputs the high/one signal to the process and temperature calibration cells 428. The process and temperature calibration cells 428 may be implemented by any circuit that can compensate the delay timing for variations in operating conditions such as temperature. For example, the process and temperature calibration cells 428 may be implemented by sixteen delay buffers in series with a fixed bias voltage and the time for a signal to pass through the sixteen delay buffers may be monitored to provide calibration for the effects of operating conditions. After the high/one signal has passed from the flip flop 426 through the process and temperature calibration cells 428, the high/one signal is output from the process and temperature calibration cells 428 to the first delay buffer of the reference set of sixteen delay buffers 302.

Turning to the data line, an input voltage Vin is supplied as the bias to the preliminary data set of delay buffers 440 and a step input as supplied as the clock input to preliminary data set of delay buffers 440. The output of the last delay buffer of the preliminary data set of delay buffers 440 and outputs of the preliminary data 2-bit counter 442 are coupled to the AND gate 444. When all of the inputs to the AND gate 444 are high/one, the AND gate 444 outputs a high/one signal to a clock input to the flip flop 446. A voltage signal DVDD (e.g., a high digital signal) is coupled to a data input to the flip flop 446. When the AND gate 444 outputs the high/one signal the flip flop 446 outputs the high/one signal to the process and temperature calibration cells 448. The process and temperature calibration cells 448 may be implemented by any circuit that can compensate the delay timing for variations in operating conditions such as temperature. For example, the process and temperature calibration cells 448 may be implemented by sixteen delay buffers in series with a fixed bias voltage and the time for a signal to pass through the sixteen delay buffers may be monitored to provide calibration for the effects of operating conditions. After the high/one signal has passed from the flip flop 446 through the process and temperature calibration cells 448, the high/one signal is output from the process and temperature calibration cells 448 to the first delay buffer of the reference set of sixteen delay buffers 302.

The remainder of the connections and functionality of the ADC circuit 400 is the same as the description of the ADC circuit 300 of FIG. 3. Thus, the ADC circuit 400 provides additional improvements in the ability to keep delay buffers in their linear region by adding additional delay buffers (as compared with the ADC circuit 300, etc.) but reduces the area and power required for such a design by utilizing delay buffers combined with a counter to provide for multiple passes through the same delay buffers.

Figure 5:
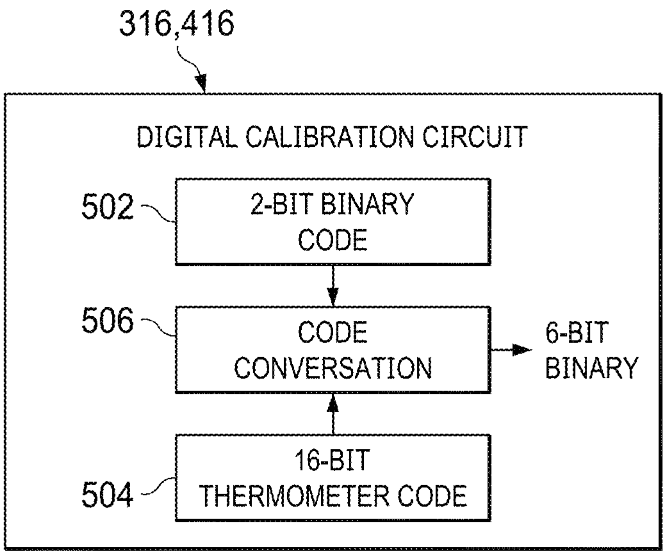
FIG. 5 illustrates an implementation of the digital calibration circuit.

FIG. 5 illustrates an implementation of the digital calibration circuit 316. According to the illustrated example, the digital calibration circuit 316 obtains a 2-bit binary code 502 (from the data 2-bit counter 310) and a 4-bit binary code 504 (from the example thermometer to binary converter 314. A code conversion circuit 506 combines the code 502 and the code 504 to generate a 6-bit binary code output. According to the illustrated example, the code conversion circuit 506 includes lines that connect the inputs to the outputs to output the 2-bit binary code 502 as the most significant bits of the 6-bit binary code output and to output the 4-bit binary code 504 as the least significant bits of the 6-bit binary code output.

While the example disclosed herein includes a thermometer to binary converter 314 that is separate from the digital calibration module 316, these components may be combined in other examples. Furthermore, while examples disclosed herein, illustrate an example that includes six bits of binary output, any number of bits may be implemented. Even further, while a 2-bit counter and sixteen delay buffers are combined in examples, any number of bits and number of delay buffers may be utilized. For example, the number of delays needed may be determined as $2^N$, where N is the number of bits desired in the output. In such an example, the number of delay buffers may be determined as $$\frac{2^N}{2^C},$$

where C is the number of bits utilized in the counter.

Figure 6:
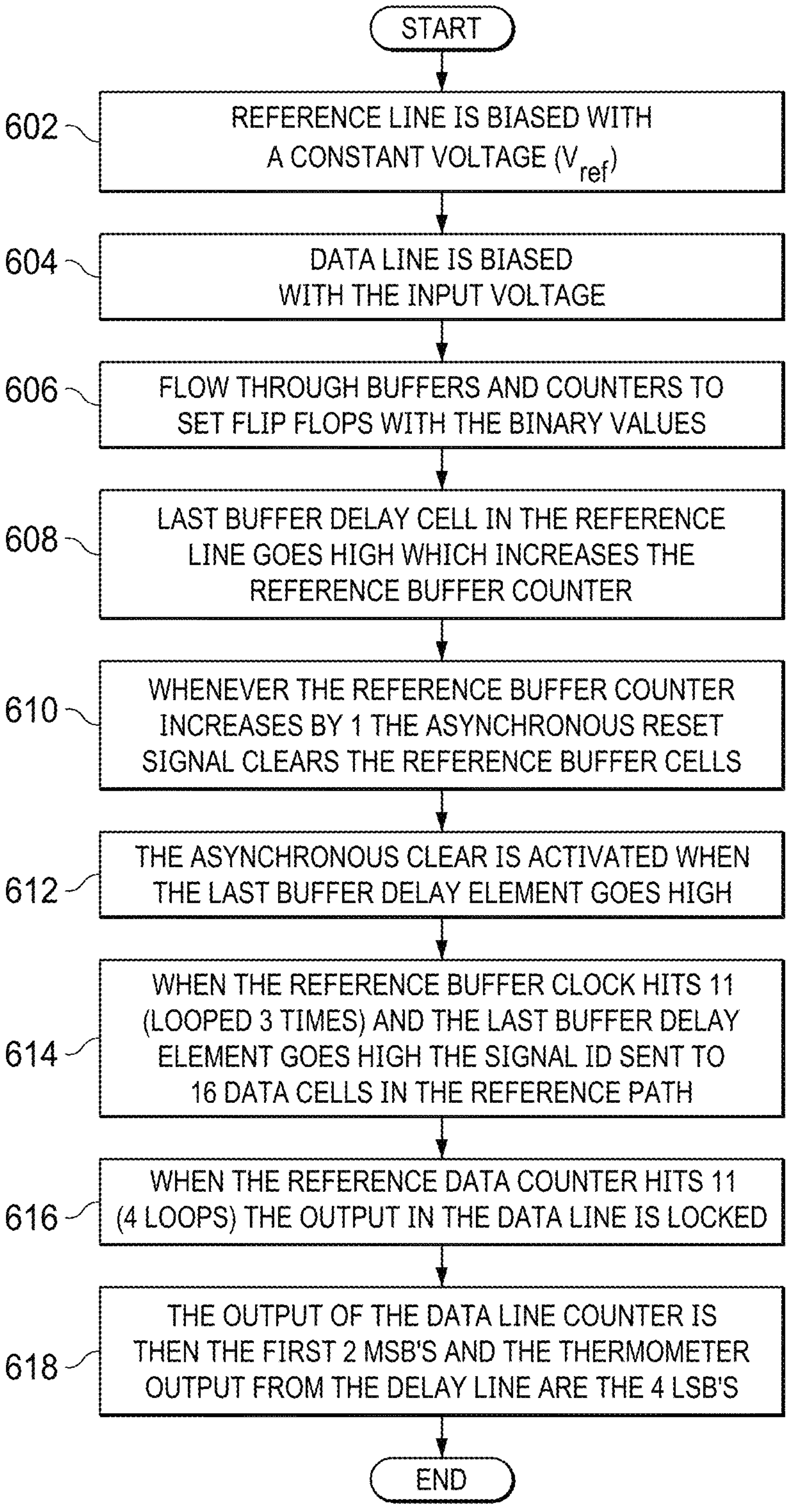
FIG. 6 is a flowchart illustrating an example process for implementing an ADC.

FIG. 6 is a flowchart illustrating an example process for implementing an ADC such as the ADC 300 and/or the ADC 400. For example, the operations in FIG. 6 may be representative of example machine-readable instructions and/or example operations 600 that may be at least one of executed, instantiated, or performed by programmable circuitry to implement an ADC. The example machine-readable instructions and/or the example operations 600 of FIG. 6 begin at block 602, at which a reference line of series-connected delay buffers is biased with a constant voltage (e.g., Vref=Vmax) that is greater than an expected analog voltage to be measured. A data line of series-connected delay buffers is biased with an input voltage (e.g., Vin) that is to be converted from an analog voltage to a digital value (block 604). A step signal is then applied substantially simultaneously to the reference delay buffers and the data delay buffers and the step signal begins to flow through the delay buffers (block 606). As the signal outputs from the last delay buffer in each series of data buffers, a counter is incremented (block 608). Whenever a counter increments, a reset signal is sent to the delay buffers to start another round/pass of delays (block 610). When the reference buffer clock hits 1,1 (e.g., after four loops through the series of delay buffers), and outputs in the data line are locked into the flip flops (block 612). For example, while the delay buffers in the reference line will always delay by a same fixed amount, the delay of the delay buffers in the data line will vary based on Vin. Because Vin is less than Vref applied to the reference delay buffers, the relative number of delay buffers that are activated when the reference line has completed four loops is indicative of the magnitude of the voltage of Vin relative to Vref. The output of the flip flops of the data line and the counter of the data line is then collected and processed to generate the output binary value indicative of the voltage of Vin (block 614).

In some examples, some of the components of the ADC 300 and/or the ADC 400 may be implemented by one or more integrated circuits, logic circuits, FPGAs, microprocessors, CPUs, GPUs, DSPs, or microcontrollers from any desired family or manufacturer. For example, all of the components other than the delay buffers may be implemented by a logic circuit such as a processor or microcontroller. The operations of the flowchart 600 may be implemented by such a logic circuit.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is at least one of not feasible or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of referencing at least one of a semiconductor device (e.g., a transistor), a semiconductor die containing a semiconductor device, or an integrated circuit (IC) package containing a semiconductor die during fabrication or manufacturing, "above" is not with reference to Earth, but instead is with reference to an underlying substrate on which relevant components are fabricated, assembled, mounted, supported, or otherwise provided. Thus, as used herein and unless otherwise stated or implied from the context, a first component within a semiconductor die (e.g., a transistor or other semiconductor device) is "above" a second component within the semiconductor die when the first component is farther away from a substrate (e.g., a semiconductor wafer) during fabrication/manufacturing than the second component on which the two components are fabricated or otherwise provided. Similarly, unless otherwise stated or implied from the context, a first component within an IC package (e.g., a semiconductor die) is "above" a second component within the IC package during fabrication when the first component is farther away from a printed circuit board (PCB) to which the IC package is to be mounted or attached. Semiconductor devices are often used in orientation different than their orientation during fabrication. Thus, when referring to one of or a combination of a semiconductor device (e.g., a transistor), a semiconductor die containing a semiconductor device, or an integrated circuit (IC) package containing a semiconductor die during use, the definition of "above" in the preceding paragraph (i.e., the term "above" describes the relationship of two parts relative to Earth) will likely govern based on the usage context.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by at least one of the connection reference or relative movement between those elements unless otherwise indicated. As such, connection references do not necessarily infer that two elements are directly connected or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, or ordering in any way, but are merely used as at least one of labels or arbitrary names to distinguish elements for ease of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to at least one of manufacturing tolerances or other real-world imperfections. For example, "approximately" and "about" may indicate such dimensions may be within a tolerance range of +/−10% unless otherwise specified herein.

As used herein "substantially real time" refers to occurrence in a near instantaneous manner recognizing there may be real world delays for computing time, transmission, etc. Thus, unless otherwise specified, "substantially real time" refers to real time+1 second.

As used herein, the phrase "in communication," including variations thereof, encompasses one of or a combination of direct communication or indirect communication through one or more intermediary components, and does not require direct physical (e.g., wired) communication or constant communication, but rather also includes selective communication at least one of periodic intervals, scheduled intervals, aperiodic intervals, or one-time events.

As used herein, "programmable circuitry" is defined to include at least one of (i) one or more special purpose electrical circuits (e.g., an application specific circuit (ASIC)) structured to perform specific operation(s) and including one or more semiconductor-based logic devices (e.g., electrical hardware implemented by one or more transistors), or (ii) one or more general purpose semiconductor-based electrical circuits programmable with instructions to perform one or more specific functions(s) or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations or functions, Field Programmable Gate Arrays (FPGAs) that may be programmed with second instructions to at least one of configure or structure the FPGAs to instantiate one or more operations or functions corresponding to the first instructions, Graphics Processor Units (GPUs) that may execute first instructions to perform one or more operations or functions, Digital Signal Processors (DSPs) that may execute first instructions to perform one or more operations or functions, XPUs, Network Processing Units (NPUs) one or more microcontrollers that may execute first instructions to perform one or more operations or functions or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example an integrated circuit may be implemented as one or more of an ASIC, an FPGA, a chip, a microchip, programmable circuitry, a semiconductor substrate coupling multiple circuit elements, a system on chip (SoC), etc.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., at least one of programmed or hardwired) at a time of manufacturing by a manufacturer to at least one of perform the function or be configurable (or re-configurable) by a user after manufacturing to perform the function/or other additional or alternative functions. The configuring may be through at least one of firmware or software programming of the device, through at least one of a construction or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

In the description and claims, described "circuitry" may include one or more circuits. A circuit or device that is described herein as including certain components may instead be adapted to be coupled to those components to form the described circuitry or device. For example, a structure described as including one or more semiconductor elements (such as transistors), one or more passive elements (such as one of or a combination of resistors, capacitors, or inductors), or one or more sources (such as voltage and/or current sources) may instead include only the semiconductor elements within a single physical device (e.g., at least one of a semiconductor die or integrated circuit (IC) package) and may be adapted to be coupled to at least some of the passive elements or the sources to form the described structure either at a time of manufacture or after a time of manufacture, for example, by at least one of an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in at least one of series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and some features illustrated as being internal to the integrated circuit may be incorporated outside of the integrated. As used herein, the term "integrated circuit" means one or more circuits that are at least one of: (i) incorporated in/over a semiconductor substrate; (ii) incorporated in a single semiconductor package; (iii) incorporated into the same module; or (iv) incorporated in/on the same printed circuit board.

Uses of the phrase "ground" in the foregoing description include at least one of a chassis ground, an Earth ground, a floating ground, a virtual ground, a digital ground, a common ground, or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

From the foregoing, it will be appreciated that example systems, apparatus, articles of manufacture, and methods have been described that implement delay lines (e.g., delay lines utilized in analog to digital converters) in a manner that reduces area, power, etc. by utilizing a counter to loop a signal through the same delay circuit elements multiple times. Described systems, apparatus, articles of manufacture, and methods are also directed to one or more improvement(s) in the operation of a machine such as a computer or other electronic, electromechanical, or mechanical device.

What is claimed is:

1. A buffer line apparatus comprising:

a first delay buffer having a clock input, a bias input coupled to a delay control input, a reset input, and an output;

a second delay buffer having a clock input coupled to the output of the first delay buffer, a bias input coupled to the delay control input, a reset input, and an output; and a counter having a clock input coupled to the output of the second delay buffer, a reset output coupled to a clear input of the first delay buffer and the clear input coupled to the second delay buffer, and an output.

2. The buffer line apparatus of claim 1, wherein the clock input of the second delay buffer is coupled to the output of the first delay buffer.

3. The buffer line apparatus of claim 1, further including a plurality of delay buffers coupled to the first delay buffer.

4. The buffer line apparatus of claim 3, wherein the plurality of delay buffers includes fourteen delay buffers.

5. The buffer line apparatus of claim 1, wherein the counter is a 2 bit counter.

6. An analog to digital converter apparatus comprising:

an analog delay control input;

a signal input;

a plurality of delay buffers connected in series, a first delay buffer of the plurality of delay buffers coupled to the signal input;

a first counter having a clock input coupled to an output of a last delay buffer in the plurality of delay buffers;

a plurality of flip flops including clock inputs respectively coupled to outputs of the delay buffers of the plurality of delay buffers;

a thermometer to binary converter coupled to outputs of the plurality of flip flops; and binary data outputs based on an output of the first counter and outputs of the thermometer to binary converter.

7. The analog to digital converter apparatus of claim 6, wherein the output of the first counter includes a plurality of outputs.

8. The analog to digital converter apparatus of claim 6, wherein the plurality of delay buffers includes X delay buffers, where $$X = \frac{2^Y}{2^Z},$$

where Y is a number of bits in the binary data outputs and Z is a number of bits of the first counter.

9. The analog to digital converter apparatus of claim 6, further including:

a second plurality of delay buffers connected in series; and a second counter having a clock input coupled to an output of a last buffer in the second plurality of delay buffers.

10. The analog to digital converter apparatus of claim 9, wherein a number of delay buffers the plurality of delay buffers is equal to a number of delay buffers in the second plurality of delay buffers.

11. The analog to digital converter apparatus of claim 9, further including a logic gate coupled to the output of the last buffer in the plurality of delay buffers and an output of the second counter.

12. The analog to digital converter apparatus of claim 11, wherein the logic gate is an AND gate.

13. The analog to digital converter apparatus of claim 9, wherein the first counter and the second counter are 2-bit counters.

14. The analog to digital converter apparatus of claim 11, further including a flip flop having a clock input coupled to an output of the logic gate and an output.

15. The analog to digital converter apparatus of claim 14, wherein an output of the second counter is coupled to the clock input of the flip flop.

16. The analog to digital converter apparatus of claim 6, wherein the binary data outputs include an output of the first counter as the most significant bits and an output of the thermometer to binary converter as the least significant bits.

17. A method to convert an analog voltage to a digital value, the method comprising:

repeatedly passing a signal through a first series of delay buffers biased by a reference voltage;

repeatedly passing the signal through a second series of delay buffers biased by an input voltage;

after the signal has passed through the first series of delay buffers a set number of times, determining a number of delay buffers in the second series of delay buffers that the signal has passed through and the number of loops; and outputting a binary value based on the number of delay buffers in the second series of delay buffers that the signal has passed through and the number of passes through the second series of delay buffers.

18. The method of claim 17, further including resetting the first series of delay buffers after each pass through the first series of delay buffers.

19. The method of claim 17, further including counting the number of passes of the signal through the first series of delay buffers.

20. The method of claim 17, wherein outputting the binary value includes generating the binary value with a most significant bits as a binary value indicative of the number the number of passes through the second series of delay buffers and a least significant bits as the a binary number indicative of the number of delay buffers in the second series of delay buffers that the signal has passed through.

* * * * *